(12) United States Patent
Ikegami

(10) Patent No.: US 7,622,394 B2
(45) Date of Patent: Nov. 24, 2009

(54) METHOD OF FABRICATING SEMICONDUCTOR DEVICE INCLUDING FORMING A PROTECTIVE LAYER AND REMOVING AFTER ETCHING A TRENCH

(75) Inventor: Naokatsu Ikegami, Saitama (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 0 days.

(21) Appl. No.: 11/391,353

(22) Filed: Mar. 29, 2006

(65) Prior Publication Data
US 2006/0223324 A1 Oct. 5, 2006

(30) Foreign Application Priority Data
Mar. 30, 2005 (JP) ............... 2005-097170

(51) Int. Cl.
H01L 21/31 (2006.01)
H01L 21/302 (2006.01)
H01L 21/461 (2006.01)

(52) U.S. Cl. ........................ 438/719; 438/780

(58) Field of Classification Search ................ 438/719, 438/780; 257/E21.245
See application file for complete search history.

(56) References Cited

U.S. PATENT DOCUMENTS

| | | | | |
|---|---|---|---|---|
| 3,773,544 A | * | 11/1973 | Newton et al. ............... | 428/609 |
| 5,501,893 A | | 3/1996 | Laermer et al. | |
| 5,520,299 A | * | 5/1996 | Belcher et al. ................ | 216/66 |
| 6,277,756 B1 | | 8/2001 | Ohara et al. | |
| 6,924,235 B2 | * | 8/2005 | Johnson et al. ............. | 438/689 |
| 7,153,716 B2 | * | 12/2006 | Ikegami ...................... | 438/51 |
| 7,172,964 B2 | * | 2/2007 | Ko et al. ..................... | 438/627 |
| 2004/0005775 A1 | * | 1/2004 | Chou et al. ................. | 438/653 |
| 2007/0077781 A1 | * | 4/2007 | Lee et al. .................... | 438/781 |
| 2007/0131652 A1 | * | 6/2007 | Okune et al. ................ | 216/67 |

FOREIGN PATENT DOCUMENTS

| | | |
|---|---|---|
| JP | 05-293111 | 11/1993 |
| JP | 2000-299310 | 10/2000 |

* cited by examiner

Primary Examiner—William M. Brewster
(74) Attorney, Agent, or Firm—Rabin & Berdo, P.C.

(57) ABSTRACT

The method of fabricating a semiconductor device includes subjecting a semiconductor substrate to trench etching by alternately repeating an etching step and a deposition step. The etching step creates a trench structure by dry-etching the exposed surface of the semiconductor substrate. An etching mask is formed on the surface of the semiconductor substrate so that the semiconductor substrate has the exposed portion. The deposition step deposits a protection film for suppressing etching of the trench side walls. The method of fabricating a semiconductor device also includes subjecting the semiconductor substrate that has just undergone the trench etching to a heat treatment at a predetermined temperature. The semiconductor substrate is heat-treated within a temperature range of 300 to 500° C. immediately following the trench etching, for example. Plasma ashing is then performed.

15 Claims, 5 Drawing Sheets

METHOD OF FABRICATING SEMICONDUCTOR DEVICE INCLUDING FORMING A PROTECTIVE LAYER AND REMOVING AFTER ETCHING A TRENCH

BACKGROUND OF THE INVENTION

1. Field of the Invention

The present invention relates to a method of fabricating a semiconductor device such as a MEMS (Micro Electrical Mechanical System) device or MIST (Micro System Technology) device and, more particularly, to a trench side wall treatment following deep trench etching that employs a dry etching technology for forming a three-dimensional structure in a semiconductor substrate.

2. Description of the Related Art

In recent years, attention has been focused on microetching that utilizes semiconductor fine etching technologies to fabricate very minute structures of sizes on the order of a few 100 µm. The application of such minute structures in various sensors and in optical switches and high frequency (RF) products and so forth in the optical communication field has been studied.

Generally, because such microetching-applied products are fabricated using Si processes, these products can be integrated on a chip with a signal processing system LSI. As a result, a system having a certain single function can be built on a chip. Elements with such a function are known as MEMS devices in the U.S.A and MIST devices in Europe.

In order to fabricate the MEMS structure or device, etching generally with a width of several tens of µm, and a depth of several hundred µm or more (aspect ratio is 10 or more) is necessary, although such etching also varies depending on the intended structure. The aspect ratio is a value obtained by dividing lateral width by vertical width.

Such dimensions are very small values from the perspective of mechatronics products. However, from the perspective of the ultra LSI fabrication processes in recent years, which require fine etching technology of no more than 0.1 µm, the above-mentioned dimensions are very large values, i.e., large patterns are to be designed. For example, the dimensions are approximately one-thousand times the gate etching dimensions.

Therefore, the fine etching technology (in particular, the dry etching technology) that has been used to fabricate the semiconductors in recent years are often not applicable as is as the MEMS structure etching technology. For example, when silicon etching with large dimensions and a high aspect ratio is to be performed by using a plasma etching device that is employed in the fabrication of ordinary ultra LSIs, the etching speed drops significantly as the etching proceeds, and etching completely stops when a certain depth is reached.

This is deeply related to the basic etching reaction mechanism of silicon: the etching reaction advances while the etching reaction is induced upon bombardment with the etched surface of accelerated ions that enter the trench perpendicularly.

The mechanism of the etching stop is considered to be attributable to the following:

(1) When the trench becomes deeper in accordance with the progress of the etching, the estimated angle of the opening as viewed from the trench bottom becomes narrower and the ion oblique incidence component is shielded by the shadowing effect.

(2) The orbit of perpendicular incident ions changes according to the charge-up at the mask and trench bottom.

(3) Because the reaction product generated inside the trench is not readily exhausted from the trench and is retained, the internal pressure of the trench rises and, as a result, the scatter and bombardment with subsequent incident ions increase. Therefore, the flux of perpendicular incident ions that play a very important role in the etching progress drops.

In the etching process that is used in the fabrication of an ultra LSI in particular, etching is generally performed by establishing the simultaneous existence, in the same plasma atmosphere, of halogen types that serve to cause etching to progress (accelerated ions such as $Cl^+$ or $F^+$, F radicals, Cl radicals, and so forth, for example) and precursors having a surface deposition characteristic (polymerization characteristic) for suppressing side etching ($C_xF_y$ radicals, for example).

The $C_xF_y$ radicals are deposited not only on the trench side walls but also on the etched surface of the trench bottom and act to obstruct the etching. Therefore, in order to cause the etching to progress effectively, the etching reaction must be made to progress while removing the obstruction layer through sputtering by means of the bombardment of accelerated ions to expose the clean etched surface (silicon surface).

However, in the bottom of a trench with a width of several tens of µm and a depth of several hundred µm as required by the MEMS structure, it is hard to obtain the bombardment of sufficient ions with the etched surface for the above reasons and, as a result, the etching obstruction layer at the trench bottom cannot be adequately removed and, ultimately, the etching stops when a certain depth is reached.

Also, the total etching time is extremely long so that the mask material retreats during the etching and there is no mask material before the desired trench shape is obtained.

This is because accelerated ions with quite a large amount of energy must enter in order for etching to progress while the etching obstruction layer is removed through sputtering. In other words, this is because it is difficult to increase the mask selectivity.

One conventional approach for solving the problems associated with the etching of the MEMS structure is a trench etching process disclosed in U.S. Pat. No. 5,501,893 and Japanese Patent Application Kokai (Laid Open) No. 2000-299310. In this trench etching process, an etching step is separated from a deposition step, and the etching and deposition steps are alternately repeated. The etching step involves an etching reaction between halogen radicals or halogen ions and the silicon. The deposition step is depositing a side-wall protection film for suppressing the etching of the side wall portion.

In the above described approach, the trench etching of silicon is carried out by alternately repeating, for example, a silicon etching step and a step of depositing a fluorocarbon polymer film. The silicon etching step employs F radicals and $F^+$ ions generated by means of $SF_6$ gas plasma by using an etching apparatus of the inductively-coupled plasma (ICP) system. The deposition step deposits the fluorocarbon polymer film for side-wall protection by means of a polymer reaction and $C_xF_y$-type surface absorption that is generated as a result of dissociation in $C_4F_8$ gas plasma.

In the etching step employing $SF_6$ plasma after the deposition step, the main role of the incident energetic $F^+$ ions is to remove the deposited film from the silicon surface at the trench bottom to expose the silicon surface. The main etching mechanism following exposure of the silicon surface of the trench bottom is basically capable of promoting the etching reaction slightly for the F radicals absorbed on the exposed silicon surface upon the bombardment of ions onto the absorbed layer, but advances as a result of the chemical reaction between the silicon and F radicals (isotropic etching reaction). Originally, the F radicals and silicon react automatically at room temperature even in the absence of ion bombardment.

As understood from the above, if the etching step that employs $SF_6$ plasma and the deposition step that employs $C_4F_8$ plasma are alternately repeated, there is absolutely no influence of an etching obstruction caused by $C_xF_y$ radicals that are diffused onto the surface from the plasma during the etching step. Thus, even when the pattern has a high aspect ratio, the balance between the trench bottom etching and film deposition does not readily collapse and, hence, the etching stop does not readily occur. In other words, a process of superior stability is provided.

In addition, because a thick protection film is formed on the surface of the etching mask by the $C_4F_8$ plasma polymerization, a very high mask selectivity of at least 100 can be achieved even if a resist mask is used. As a result, deep silicon trench etching of at least 500 μm can be achieved without being accompanied by serious mask recession.

A $C_xF_y$ plasma polymer film formed during irradiation with $C_4F_8$ plasma is deposited thickly on the trench side walls after the deep trench etching of silicon by means of the above described conventional method. Usually, when this deposited film is placed as is, the deposited film is detached nonuniformly and adheres as a foreign substance to the periphery of the trench while undergoing the subsequent process.

In particular, when the deposited film adheres on a moving part of the MEMS structure, a serious problem (i.e., operational defect) is produced. Therefore, it is very important that the plasma polymer film on the trench side walls be completely removed immediately after etching.

Normally, $C_4F_8$ gas is used as a portion of the etching gas when etching a $SiO_2$ film in an ultra LSI fabrication process, and the $C_xF_y$ plasma polymer film deposited on the underlying silicon and $SiO_2$ pattern side walls following etching can be easily removed by oxide plasma ashing that is used in a normal ultra LSI fabrication process.

However, when the trench side walls undergo the deep trench etching using the ICP plasma etching apparatus, the deposited fluorocarbon plasma polymer film cannot be completely removed in the plasma ashing. This fact was ascertained by way of experimentation by the inventor. The inventor though that the causes include the strong promotion of dissociation by high-density ICP plasma (on the order of plasma density=$10^{12}$ [/cm$^3$]) of the ICP plasma etching apparatus, and the fact that the gas used in the deposition step is only $C_4F_8$.

The inventor thought that the $C_4F_8$ gas is highly dissociated in the plasma so that a film containing a large number of C—C bonds with a strong associative strength are formed and, as a result, detachment of the film becomes difficult. In addition, the inventor thought that the $SiF_4$, which is the reaction product, is re-dissociated within the plasma and, consequently, Si is released in the plasma atmosphere and re-introduced to the film. Thus, the inventor thought that the resulting film is a rigid film containing an inorganic component that is not easily detached by oxide plasma alone.

SUMMARY OF THE INVENTION

The present invention was conceived to solve the conventional problem that a plasma polymer film deposited on the trench side walls following the trench etching cannot be removed by means of ashing that employs oxide plasma.

An object of the present invention is to provide a method of fabricating a semiconductor device in which the plasma polymer film deposited on the trench side walls has a superior detachment characteristic.

According to a first aspect of the present invention, there is provided an improved method of fabricating a semiconductor device. The method includes subjecting a semiconductor substrate to trench etching by alternately repeating an etching step and a deposition step to form a trench structure. The etching step includes dry-etching an exposed surface of the semiconductor substrate not covered with an etching mask. The deposition step deposits a protection film on side walls of the trench structure for suppressing etching of the trench side walls. The method also includes subjecting the semiconductor substrate to a heat treatment at a predetermined temperature following the trench etching.

Preferably, the heat treatment is performed within a temperature range of 300 to 500° C., directly after the trench etching. Preferably, plasma ashing is performed after the heat treatment.

The present invention can improve the detachment of the polymer film from the trench side walls by conducting the heat treatment within a temperature range of 300 to 500° C., for example, after the trench etching and before plasma ashing treatment.

DETAILED DESCRIPTION OF THE INVENTION

First Embodiment

The method of fabricating a MEMS device according to the first embodiment of the present invention is characterized in that, directly after the silicon trench etching, heating is performed within a temperature range of 300 to 500° C. followed by oxide plasma ashing to remove the fluorocarbon plasma polymer film deposited on the trench side walls.

[A] Trench Etching

Figure 1:
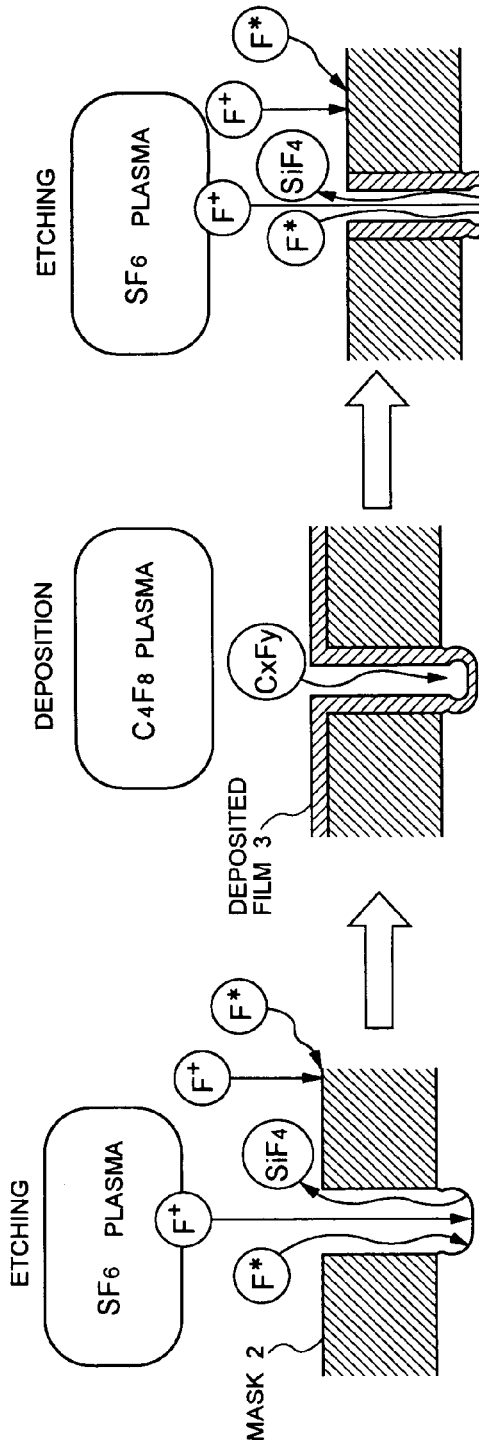
FIG. 1A to FIG. 1D illustrate a sequence of trench etching according to a first embodiment of the present invention.

FIG. 1A to FIG. 1D are a series of diagrams to illustrate a sequence of the silicon trench etching of the first embodiment of the present invention. In the first embodiment (FIG. 1A to FIG. 1D), trench etching of silicon 1 is performed by alternately repeating a silicon etching step (FIGS. 1A and 1C) and a deposition step (FIG. 1B and FIG. 1D). The silicon (Si-sub) 1 is a semiconductor substrate (wafer). The silicon etching step includes forming a photoresist etching mask 2 on the silicon 1, and etching the silicon with F radicals (F*) and F+ ions generated by $SF_6$ gas plasma. The deposition step includes depositing the film 3 of a fluorocarbon polymer film for side wall protection. The deposition step uses a polymer reaction and surface absorption of $C_xF_y$-type that is generated through disassociation in $C_4F_8$ gas plasma.

Figure 2:
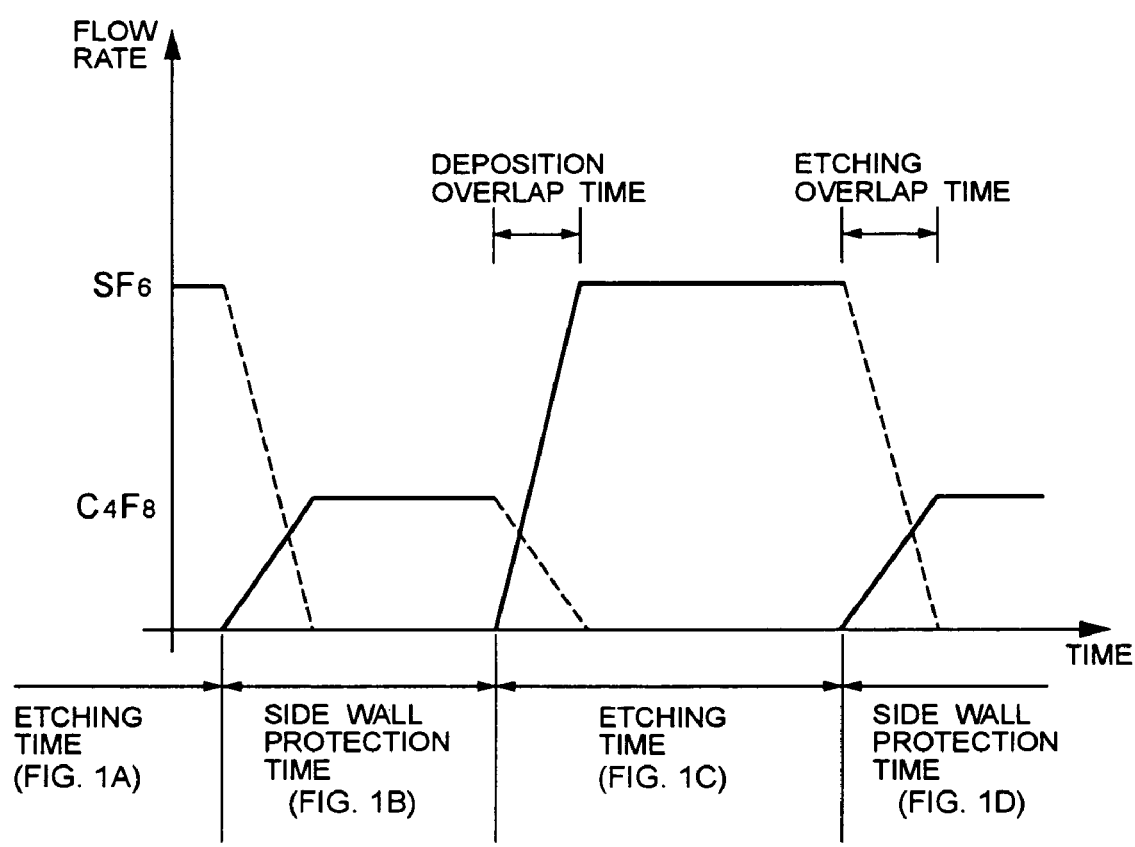
FIG. 2 illustrates switching of the process conditions in the trench etching of FIG. 1A to FIG. 1D.

FIG. 2 illustrates a sequence (time axis) for switching the etching conditions with two different kinds of introducing gases in the trench etching of FIG. 1A to FIG. 1D. The etching is performed under the following conditions, for example: an etching apparatus of the inductively-coupled plasma (ICP) system is used, the temperature of an electrode for securing the wafer is fixed at 10° C., the introducing gas pressure during etching is 3.5 Pa, the source power is 1800 W, and the bias power is 15 W. The trench etching of the silicon 1 is performed with the $SF_6$ introduction time (flow rate=300 sccm) being 7 sec (Etching Time in FIG. 2) and the $C_4F_8$ introduction time (flow rate=200 sccm) being 2 sec (Side Wall Protection Time in FIG. 2). Thus, the perpendicular etching with a trench width of 80 μm and a depth of 500 μm is implemented.

In the etching step with $SF_6$ plasma in FIG. 1C, the main role of the incident energetic $F^+$ ions is to expose the surface of the silicon 1 at the trench bottom by removing a deposition film 3 on the surface of the silicon 1 at the trench bottom. Of course, the deposition film 3 on the surface of the etching mask 2 is also removed by the incident energetic $F^+$ ions. The main etching mechanism following exposure of the surface of the silicon 1 at the trench bottom basically advances in a chemical reaction (isotropic etching reaction) between the silicon 1 and the F radicals (F* in FIG. 1C). Originally, the F radicals and silicon 1 react automatically at room temperature even in the absence of ion bombardment. It should be noted that the $F^+$ ions are able to promote the etching reaction slightly for the F radicals absorbed in the surface of the silicon 1 as a result of the bombardment of ions with the absorbed layer.

In the etching according to the above-described conditions, the characteristic unevenness representing traces at the time of switching the steps is seen in the shape of the trench side walls. However, because there is absolutely no influence from an etching obstruction caused by $C_xF_y$ radicals that are diffused onto the surface from the plasma during the etching step, the balance between the trench bottom etching and film deposition does not readily collapse even when the pattern has a high aspect ratio. Hence, an etching stop does not readily occur and a process of superior stability is provided.

In addition, a thick protection film is formed as a result of $C_4F_8$ plasma polymerization on the surface of the etching mask so that a very high mask selectivity of at least 100 can be achieved even when a resist mask is used. Consequently, deep silicon trench etching of at least 500 μm can be achieved without being accompanied by serious mask recession.

[B] Heat Treatment

Immediately after the trench etching, the fluorocarbon plasma polymer film on the silicon surface is partially thermal-decomposed by performing a heat treatment in a temperature range of 300 to 500° C.

For example, in an $N_2$ atmosphere at atmospheric pressure, the temperature is raised at a rising speed of 1° C./sec from room temperature up to a maximum temperature (e.g., 400° C.). Then, the maximum temperature 400° C. is held for 10 minutes. Subsequently, the temperature is lowered to room temperature.

[C] Plasma Ashing

After the heat treatment, the fluorocarbon polymer film deposited on the trench side walls is removed by performing oxide plasma ashing on the silicon 1.

The removal of the plasma polymer film from the trench side walls is significantly improved when the above described heat treatment is conducted before the oxide plasma ashing, as compared with when only the oxide plasma ashing is performed without the heat treatment.

EXPERIMENTS

The following experiments were performed in order to indirectly study in detail how the fluorocarbon polymer film on the side walls had decomposed as a result of performing the heat treatment after performing the trench etching of the silicon under the above-mentioned conditions with the ICP plasma etching apparatus. FIG. 3A to FIG. 5 show the experiment results.

Experiment 1

Deposition of Polymer Film

One silicon sample was prepared by cleaving a silicon wafer. The silicon sample was a 10 mm×10 mm piece. The ICP-plasma deposition step was conducted such that $C_4F_8$ plasma was irradiated for one minute onto the surface of the silicon wafer to deposit a fluorocarbon polymer film onto the silicon wafer surface. Thus, the fluorocarbon polymer film deposited on the pattern side walls was reproduced in simulated fashion.

Experiment 2

Heating

Thereafter, the cleaved silicon sample on which the fluorocarbon polymer film had been deposited was introduced into a chamber of an ultrahigh vacuum (degree of vacuum is $1 \times 10^{-9}$ Torr) thermal desorption spectroscopy (TDS) apparatus that was equipped with a quadrupole mass spectroscopy (QMS) apparatus. The silicon sample was heated to one of four maximum temperatures from room temperature (20° C.) at a rising temperature speed of 1° C./sec, by irradiating the silicon sample with infrared rays from the outside. The four maximum temperatures were 180° C., 340° C., 500° C. and 700° C. It should be noted that the single sample was used in five different ways. First, the sample was not heated, i.e., it was maintained at 20° C., and the surface of this sample was investigated. The investigation (i.e., observation of the sample surface after heating) will be described in the Experiment 3. Second, the same sample was heated to 180° C., and the sample surface was investigated. Third, the same sample was heated to 340° C., and the sample surface was investigated. Fourth, the same sample was heated to 500° C., and the sample surface was investigated. Fifth, the same sample was heated to 700° C., and the sample surface was investigated. The silicon sample was maintained at each maximum temperature for 10 minutes, and cooled to room temperature. Thus, the thermal decomposition (thermal decomposition through heating) of the fluorocarbon polymer film deposited on the trench side walls was reproduced in simulated fashion. Therefore, the fluorocarbon polymer film on the silicon sample surface was partly thermal-decomposed.

Experiment 3

Observation of Surface After Heating

In order to investigate the effect of thermal decomposition of the fluorocarbon polymer film deposited on the trench side walls, the sample was introduced to an ultrahigh vacuum XPS (X-ray Photoelectron Spectroscopy) apparatus by means of vacuum transfer each time the heating (20° C., 180° C., 340° C., 500° C. and 700° C.) was conducted. The sample surface state was observed, and a C1s (comes from the electron orbit 1s in a carbon atom) photoelectron spectra (See FIG. 3A) and an F1s (comes from the electron orbit 1s in a fluorine atom) photoelectron spectra (See FIG. 3B) were investigated. The experiment results shown in FIGS. 3A and 3B indicate the results of performing a plurality of heat treatments on the single sample by changing the maximum temperature in the stepwise manner from the lowest temperature to the highest temperature and performing the XPS analysis after each single heat treatment, as mentioned earlier.

It can be seen from the C1s photoelectron spectra at 20° C. (room temperature) shown in FIG. 3A that the fluorocarbon plasma polymer film formed by means of the $C_4F_8$-ICP plasma irradiation is constituted by the components $CF_3$, $CF_2$, CF, and C—$CF_x$.

Figure 3B:
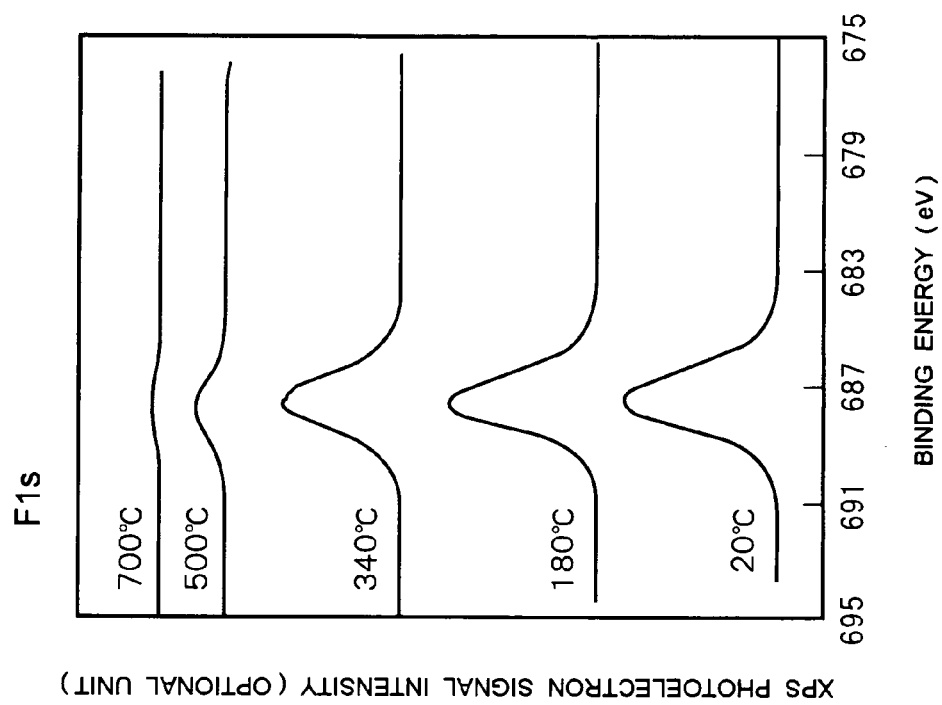
FIG. 3A and FIG. 3B show the variations in the photoelectron spectra, caused by the different heating temperatures, of the fluorocarbon polymer film of the Si surface irradiated with $C_4F_8$ ICP plasma.
Figure 3A:
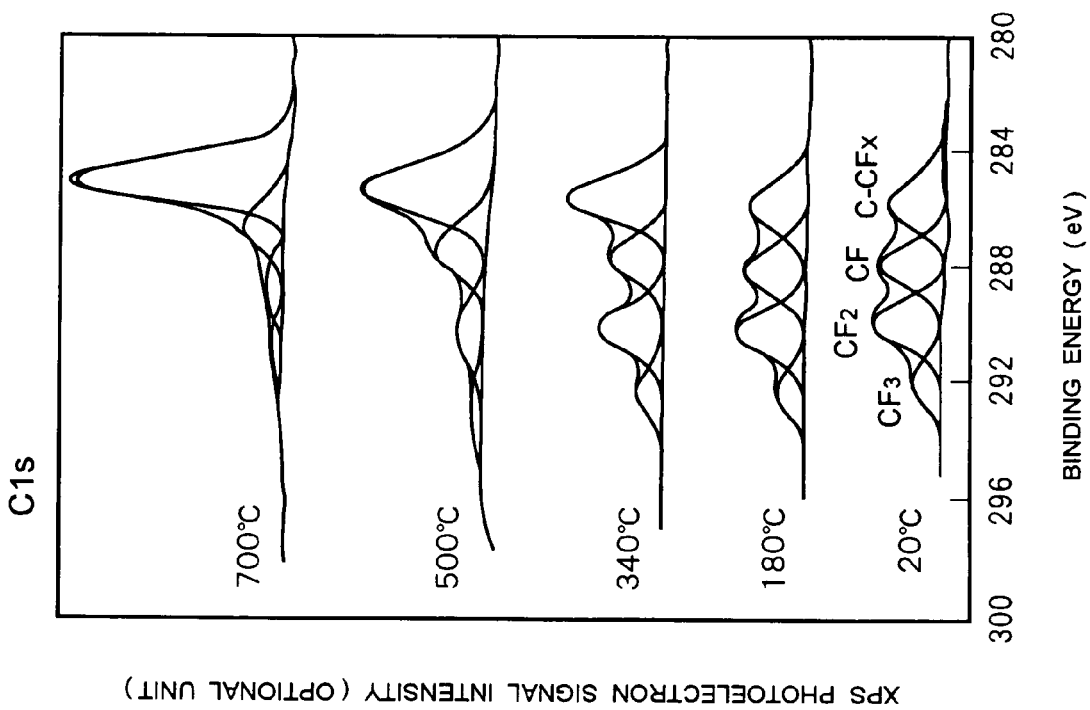

Looking at the spectra variation at the respective temperatures in FIGS. 3A and 3B, it can be seen that the fluorocarbon polymer film does not change at all in the heat treatment up to 180° C. but, at 340° C., the peak areas of the respective components of $CF_3$, $CF_2$, CF, and C—$CF_x$ are reduced. When the results in FIG. 3B are considered, the peak intensity of the F1s photoelectron spectrum at 340° C. is also reduced. The trend accelerates further at 500° C. and, in the results of FIG. 3A in particular, it is clear that the binding energy of the C—$CF_x$ bonds has shifted to the binding energy of the C—C bonds in the lower energy at around 284 eV. This indicates that F is selectively desorbed due to the thermal decomposition of the fluorocarbon polymer film and changes into a C-rich film. Based on these analysis, the inventor considers that the threshold value at which the thermal decomposition is started exists between 180° C. and 340° C. for the fluorocarbon polymer film.

Figure 4:
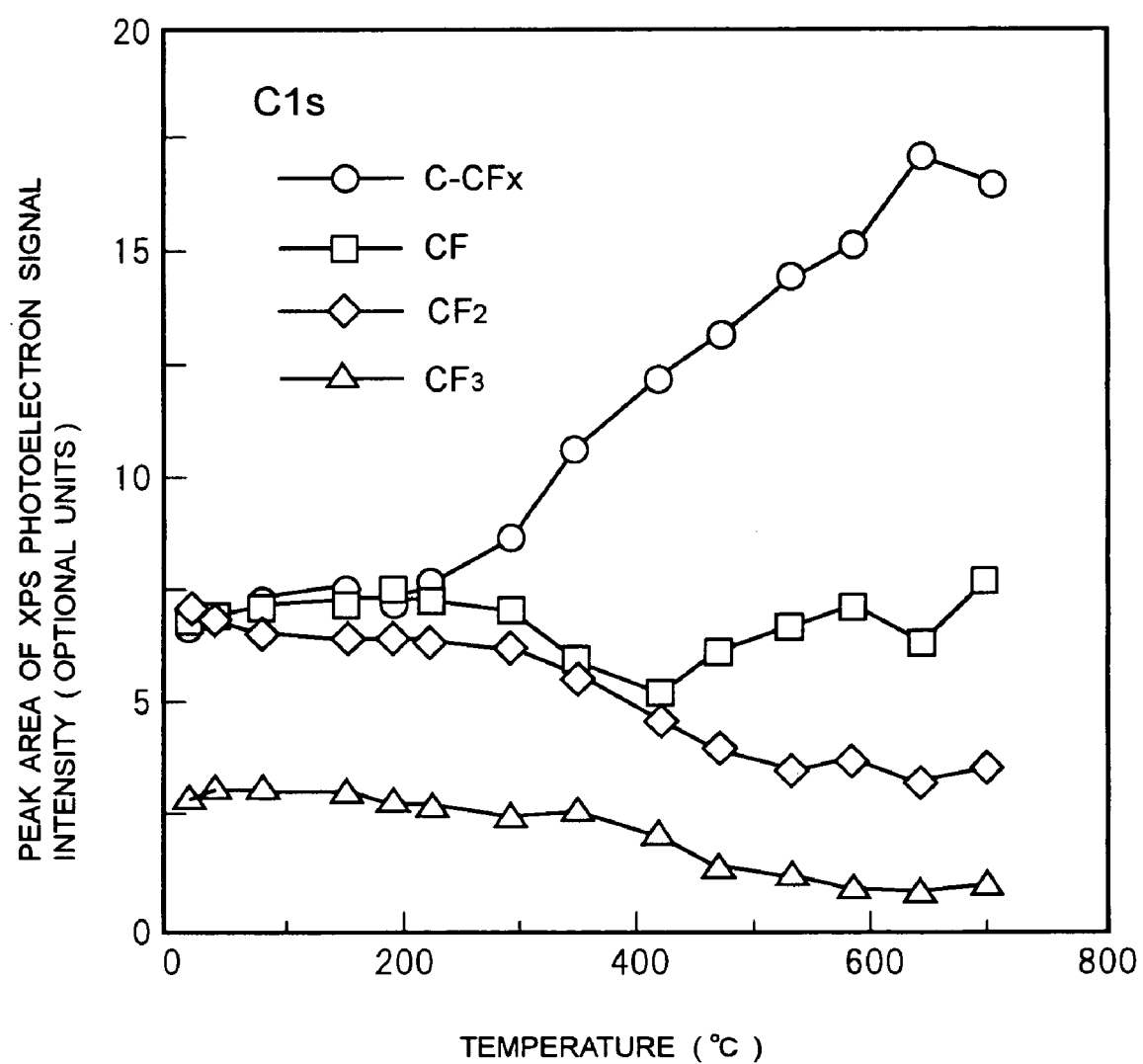
FIG. 4 shows the variation in the XPS peak area of the C1s photoelectron spectra in FIG. 3A.

FIG. 4 shows the detailed plotting of temperature variations in the peak area of XPS photoelectron signal intensity of each component of the C1s photoelectron spectra in FIG. 3A in order to estimate the threshold value at which the thermal decomposition is started. It can be seen from FIG. 4 that, at 300° C. or higher, the respective peak areas of CF, $CF_2$ and $CF_3$ are reduced and the peak area of C—$CF_x$ has increased. It is considered that C—$CF_x$ increases due to an increase in the peak intensity of the C—C bonds that exist at a binding energy of immediate vicinity. Therefore, it can be seen from the results of FIG. 4 that the thermal decomposition of the fluorocarbon polymer film starts at 300° C. or higher and carbonization (increase in C—C bonds) proceeds. The increase in the peak area of the CF bonds at 400° C. or higher is considered to be due to the change to CF bonds, as the $CF_3$ and $CF_2$ are thermal-decomposed and F is selectively desorbed.

Experiment 4

Observation of Desorption Species During Heating

Figure 5:
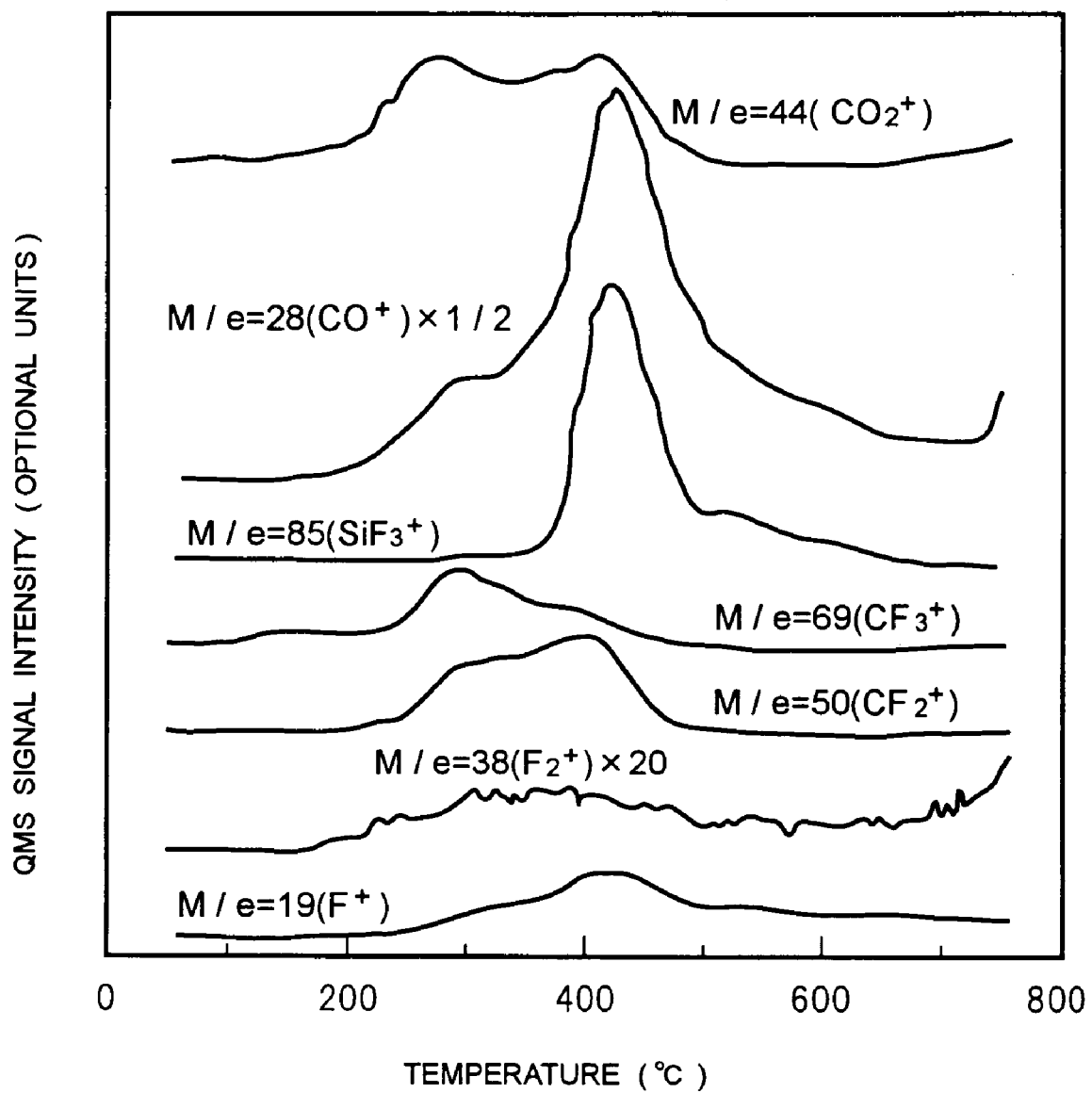
FIG. 5 shows the temperature spectra of the mass fragment that is separated from the Si surface irradiated with $C_4F_8$ ICP plasma.

In order to investigate the molecular components that are desorbed from the silicon surface as a result of heat treatment, the temperature spectra of the flux of the desorbed species from the sample surface was investigated by using a quadrupole mass spectroscopy (QMS) apparatus installed in the chamber of the ultrahigh vacuum thermal desorption spectroscopy apparatus during the heat treatment (See FIG. 5).

FIG. 5 shows the temperature spectra of mass fragments M/e=44($CO_2^+$), M/e=28($CO^+$), M/e=85($SiF_3^+$), M/e=69 ($CF_3^+$), M/e=50($CF_2^+$), M/e=38($F_2^+$), and M/e=19($F^+$).

It can be seen from the temperature spectra in FIG. 5 that the decomposition of the plasma polymer film starts from a point close to 300° C. It can also be understood from FIG. 5 that the plasma polymer film decomposes sharply with the peak at approximately 400° C., and decomposition substantially ends in the vicinity of 500° C. Further, it is clear from FIG. 5 that substantially zero mass fragments of $CF_2$ and $CF_3$ are desorbed from the sample surface at 500° C. or higher and the fluorocarbon polymer film is therefore sufficiently thermal-decomposed at 500° C. The processing at higher temperatures can create the inconvenience that carbonization is made to advance, whereby insufficient removal is possible in the subsequent removal process. Hence, it is found that 500° C. is suitable as the upper limit for the temperature of the heat treatment.

It is ascertained from the experimental results shown in FIG. 3A to FIG. 5 that the polymer film can be effectively thermal-decomposed by performing a heat treatment within a temperature range of 300 to 500° C.

These experiments employ the thermal desorption spectroscopy (TDS) chamber and XPS apparatus, and are performed in the ultrahigh vacuum apparatus to analyze the silicon sample surface. Thus, the chamber atmosphere and vacuum of the experiments differ from the actual process in the $N_2$ atmosphere at atmospheric pressure. However, the results obtained in the $N_2$ atmosphere at atmospheric pressure agree with the results shown in FIG. 3A to FIG. 5. This fact shows that the important factor in the thermal decomposition of the fluorocarbon polymer film is not the vacuum or gas atmosphere but rather temperature.

In the first embodiment, as described above, by performing a heat treatment within a temperature range of 300 to 500° C. directly after the trench etching, the plasma polymer film of the trench side walls is significantly removed, in comparison with a case where only the conventional oxide plasma ashing is performed.

Second Embodiment

The first embodiment shows that the detachment of the fluorocarbon polymer film from the silicon trench side walls is remarkably improved by applying a heat treatment immediately after the trench etching. However, the components of the plasma polymer film deposited on the trench side walls may include not only a fluorocarbon group but also an Si-containing inorganic substance that is generated as a result of the re-dissociation of the reaction product ($SiF_4$ or the like) in the plasma. Removal of this Si-group inorganic component simply by means of a heat treatment is sometimes insufficient.

Therefore, the method of fabricating a MEMS device according to the second embodiment is characterized in that the Si-group inorganic component deposited on the trench side walls is removed by performing an acid treatment after the heat treatment of the first embodiment.

For example, the inventor confirmed that the detachment results are improved by performing a plasma ashing treatment after immersing the heat-treated silicon 1 (See FIG. 1) in a mixed solution of acetic acid/ammonium fluoride/ammonium hydrogen fluoride for ten minutes.

As described above, even if the removal of the fluorocarbon polymer film from the trench side walls is insufficient by means of only a heat treatment and a plasma ashing treatment, the second embodiment can improve the removal of the fluorocarbon polymer film from the trench side walls by adding an acid treatment after the heat treatment.

Although an MEMS (MIST) device fabrication method is described in the first and second embodiments, the present invention can also be applied to other semiconductor device fabrication methods that perform trench etching.

This application is based on Japanese Patent Application No. 2005-97170 filed on Mar. 30, 2005, and the entire disclosure thereof is incorporated herein by reference.

What is claimed is:

1. A method of fabricating a semiconductor device comprising:
    subjecting a semiconductor substrate to trench etching by alternately repeating an etching step of forming a trench structure by dry-etching an exposed portion of a surface of the semiconductor substrate, the exposed portion being not covered with an etching mask that covers a remaining portion of the surface of the semiconductor substrate, and a deposition step of depositing a fluorocarbon protection film for suppressing etching of a trench side wall;
    completing the trench etching when the trench structure has a predetermined depth; and
    subjecting the semiconductor substrate to a heat treatment at a predetermined temperature following the trench etching further comprising subjecting the heat-treated semiconductor substrate to plasma ashing, thereby removing the protection film from the trench side wall.

2. The method of fabricating a semiconductor device according to claim 1, wherein the predetermined temperature is between 300° C. and 500° C.

3. The method of fabricating a semiconductor device according to claim 1, further comprising wetting the heat-treated semiconductor device with an acid solution.

4. The method of fabricating a semiconductor device according to claim 3, further comprising subjecting the wetted semiconductor substrate to plasma ashing, thereby removing the protection film from the trench side wall.

5. The method of fabricating a semiconductor device according to claim 1, wherein the semiconductor device is a MEMS device or a MIST device.

6. The method of fabricating a semiconductor device according to claim 1, wherein the etching step is performed with SF6 gas plasma and the deposition step is performed with C4F8 gas plasma.

7. The method of fabricating a semiconductor device according to claim 1, wherein the protection film is a fluorocarbon polymer film.

8. The method of fabricating a semiconductor device according to claim 1, wherein the trench structure obtained by the trench etching is about 80 μm in width and about 500 μm in depth.

9. The method of fabricating a semiconductor device according to claim 1, wherein the heat treatment is performed by raising a temperature at a rate of 1° C./sec up to the predetermined temperature from room temperature, maintaining the predetermined temperature for a predetermined period and lowering the temperature to the room temperature.

10. The method of fabricating a semiconductor device according to claim 3, wherein the acid solution includes a mixed solution of acetic acid, ammonium fluoride and ammonium hydrogen fluoride.

11. The method of fabricating a semiconductor device according to claim 1, wherein the etching mask is a resist mask.

12. The method of fabricating a semiconductor device according to claim 7, wherein the heat treatment partially decomposes the protection film on the trench side wall.

13. The method of fabricating a semiconductor device according to claim 6, wherein the heat treatment partially decomposes the protection film on the trench side wall.

14. The method of fabricating a semiconductor device according to claim 1, wherein the heat treatment partially decomposes the protection film on the trench side wall.

15. A method of fabricating a semiconductor device compromising:
    dry-etching an exposed portion of a surface of a semiconductor substrate, the exposed portion being not covered with an etching mask that covers a remaining portion of the surface of the semiconductor substrate, and forming a trench that includes a trench bottom and a trench sidewall, the trench bottom being defined by a bottom portion of the dry-etched surface, the trench sidewall being defined by a sidewall portion of the dry-etched surface;
    a trench etching step including sub steps of:
        depositing a fluorocarbon protection film on the trench bottom and the trench sidewall, and
        dry-etching the protection film deposed on the bottom of the trench so as to expose at least a portion of the semiconductor substrate, and further dry-etching the exposed portion of the semiconductor substrate;
    partially decomposing the protection film on the trench sidewall by heating the semiconductor substrate at a predetermined temperature following the trench etching step; and
    removing the partially-decomposed protection film from the trench sidewall by performing plasma ashing on the heated semiconductor.

* * * * *